United States Patent [19]
Mazzoni

[11] Patent Number: 5,657,237
[45] Date of Patent: Aug. 12, 1997

[54] INSTRUMENT AND METHOD FOR THE DIGITAL ELECTRONIC MEASUREMENT OF PERIODIC ELECTRICAL QUANTITIES

[75] Inventor: Erminio Mazzoni, Bazzano, Italy

[73] Assignee: Electrex S.r.l., Bazzano, Italy

[21] Appl. No.: 360,251

[22] Filed: Dec. 20, 1994

[30] Foreign Application Priority Data

Dec. 23, 1993 [EP] European Pat. Off. ............. 93830518

[51] Int. Cl.⁶ .................................................. G01R 19/145
[52] U.S. Cl. .................... 364/483; 364/481; 364/178; 364/487; 324/142; 324/140 R
[58] Field of Search ..................................... 324/650, 142, 324/140 R, 141; 364/483, 481, 178, 484, 486, 487

[56] References Cited

U.S. PATENT DOCUMENTS

| | | | |
|---|---|---|---|
| 4,174,499 | 9/1977 | Waurick | 324/107 |
| 5,059,896 | 10/1991 | Gemer et al. | 324/142 |
| 5,170,115 | 12/1992 | Kashiwabara et al. | 324/142 |
| 5,485,393 | 1/1996 | Bradford | 324/142 |

FOREIGN PATENT DOCUMENTS

| | | |
|---|---|---|
| 0462045 | 12/1991 | European Pat. Off. . |
| 0472807 | 3/1992 | European Pat. Off. . |
| 0510956 | 10/1992 | European Pat. Off. . |
| 2643457 | 9/1976 | Germany . |
| 3126485 | 7/1981 | Germany . |
| 2066969 | 7/1981 | United Kingdom . |

*Primary Examiner*—Ellis B. Ramirez
*Assistant Examiner*—Hal D. Wachsman
*Attorney, Agent, or Firm*—Dvorak & Orum

[57] ABSTRACT

The method involves use of an instrument with at least one operational amplifier to sense the analog value first of a voltage, and then of the relative current, introducing a known delay and applying a reference voltage at the amplifier input to render all the signals positive. The analog values are then converted to digital voltage and current values and are corrected by subtracting the offset value of the operational amplifier, which is given by averaging the digital values. The instrument includes an analog-digital converter as one component of a data processing unit, which further incorporates a switch, a sample-and-hold circuit, a memory with an internal shift register, and a programmable control unit which is capable of shifting the compensated current into quadrature in such a manner as to allow a direct calculation of reactive power by way of the shift register.

10 Claims, 6 Drawing Sheets

INSTRUMENT AND METHOD FOR THE DIGITAL ELECTRONIC MEASUREMENT OF PERIODIC ELECTRICAL QUANTITIES

BACKGROUND OF THE INVENTION

The present invention relates to a method for the digital electronic measurement of periodically varying electrical quantities, and to an instrument for its implementation.

In an electronic circuit connected to an a.c. power supply, many electrical quantities of a periodic nature, i.e. variable over time, can be measured by applying known electrotechnical principles. Such quantities can be grouped into two distinct categories, identifiable according to the manner in which measurement is possible. Quanities belonging to a first category, or primary quantities, namely voltage and current, can be measured directly by means of suitable instruments. Those belonging to a second category, or secondary quantities, including types of power and power factor, are quantities of which the values are deduced by way of mathematical processing operations performed on measured voltage and current values. It is therefore clear that both voltage and current must be measured in any event. Conventionally, there are two principal methods of measuring primary periodic electrical quantities, i.e. voltage and current. In the first such method, which can be utilized with reasonable confidence only under laboratory conditions, the peak or crest value, that is to say the maximum value assumed by the monitored quantity within the measured period, is converted into an equivalent direct voltage and this same equivalent direct voltage then measured. The second method, which is a sampling procedure, consists rather in effecting a selected number of measurements, or samples, of the monitored quantity and assuming the effective (r.m.s.) value as the measured value. The theoretical formula allowing calculation of the effective value of a periodic quantity having period T states that the value of the periodic quantity equals the square root of the integral from zero to period T of the squared value of the quantity, multiplied by dt. The practical formula, used in place of the theoretical for the purposes of calculation, states that the value of the periodic quantity equals the square root of the squares of single values of the quantity from 1 to n summated and divided by n, where n is the number of samples.

The first method is especially simple and can be implemented with similarly simple instruments, but is of limited practical use, being dependable only as long as the quantity to be measured is perfectly sinusoidal, hence, as aforementioned, in laboratory conditions where all potential sources of error can be monitored and eliminated.

It happens in the majority of instances, however, that the waveform of the measured quantities will be distorted due to the presence of harmonics, and any value that can be measured will be equal to the sum of different waveforms registering at a given moment; accordingly, only the second method, based on sampling, can ensure valid results.

Concentrating exclusively on the sampling method, the value obtainable, becomes that much more precise and dependable as the sampling frequency increases, since the summation tends to produce results more and more comparable with those of the integral in the theoretical mathematical formula.

The method in question is implemented typically by means of a circuit which comprises, in sequence, a differential amplifier, a sample-and-hold device, an analog-digital converter and a microprocessor. The signal reflecting the quantity to be measured is received by the amplifier and relayed, suitably amplified and with any disturbances filtered out, on to the sample-and-hold device, the function of which is to store the signals in analog form for a prescribed duration before supplying them to the input of the ADC. This converts each signal into a number and relays the number to the microprocessor, which memorizes all the values received and effects the necessary calculations. In addition, the power supply to the measuring circuit needs to be both positive and negative, as the quantity measured is generally periodic and will therefore vary between positive and negative values.

The selfsame circuit, suitably modified by the addition of various components, can be utilized to measure the active power of the monitored circuit. Such a measurement is effected by taking voltage and current samples simultaneously and multiplying together the resulting values. The formula used in the subsequent calculation states that active power is equal to the sum of the products, from 1 to n, obtained by multiplication of the voltage value with the corresponding current value, divided by n, where n is the number of samples. This practical formula is similarly valid for the calculation of reactive power, provided that current and voltage values are sampled 90° apart. The measuring circuit thus requires two operational amplifiers and two relative sample-and-hold circuits connected to the inputs of a multiplexer, of which the output stage is connected to an input of the ADC, the output of the ADC being connected in turn to an input of the microprocessor. The multiplexer first receives one signal, voltage for example, which is duly relayed to the ADC, and thereafter a second signal, current in this instance, likewise passed on to the ADC. The microprocessor therefore receives two numbers in succession, which it multiplies together. As the analog-digital conversion takes a certain amount of time, the two sample-and-hold circuits will retain the signal received from the relative amplifier for a duration at least equivalent to the period of time required by the ADC to perform the operation. The dynamic characteristic of the measuring circuit is optimized by adding a variable gain amplifier between each of the operational amplifiers and the relative sample-and-hold circuit, controlled by the microprocessor and functioning as a scale changer. Evidently, a measuring circuit of this nature is rendered somewhat costly by reason of the numerous components it comprises, and of the characteristics each such component must possess in order to ensure that its task is performed correctly: for example, the need for the various components to be connected to a power source with both positive and negative polarity in order to respond correctly to a signal which varies between positive and negative values. Also, the operation of the scale-changing variable gain amplifiers is such as to alter the operating constants of the circuit overall, since in practice the single amplifier will be composed of a number of circuits coupled in parallel, furnished with a resistor and a relative static switch. Each static switch functions as a variable resistor responding to temperature, and the gain of the amplifier is modified not only varying the number of circuits connected in parallel, through which current flows simultaneously, but more especially by shutting off one circuit rather than another. This means that a variation in resistance occasions an accompanying change in compensation, as the reference or offset values are also altered. What is more, the variable gain amplifiers need to be of superior quality, a feature dictating high cost, precisely in order to ensure effectiveness within a wide operating range compassing each of the single ranges relative to the individual scales in which measurements are to be possible.

It will be clear from the foregoing that electronic instruments currently available for the measurement of electrical quantities are typified by high cost, and that the cost rises disproportionately with any increase in performance and in the required level of precision, by reason of the need to add further elements or devices which in turn dictate the need for further corrections. In a three-phase circuit, for example, reactive power is measured by sensing voltage linked across two phases and current on the remaining phase. In single-phase circuits, on the other hand, use is made of analog devices which in order to give an acceptable level of precision must necessarily involve an appreciable cost.

In addition, again considering the calculation of reactive power and utilizing the digital sampling method with processing by the formula which states that the value of reactive power is equal to the square root of the product given by multiplication of the voltage and the current, sampled in phase and squared, subtracting the squared value of the active power also sampled in phase, one quadrant only of the waveform can be covered, so that the mathematical sign of the reactive power remains unobtainable and it cannot be established whether the monitored circuit is capacitive or inductive. The object of the present invention is to provide a method for the measurement of periodic electrical quantities, and an electronic instrument for its implementation, which will afford notable economies of construction while losing nothing in accuracy.

SUMMARY OF THE INVENTION

The stated object is realized in a method according to the present invention for the digital electronic measurement of periodic electrical quantities in an electronic circuit. The method in question-utilizes sampling techniques to measure voltage and current, also secondary quantities including active/reactive power and power factor, and comprises the steps of sensing the values of voltage and current at two terminals of the electronic circuit, converting the relative analog values into digital or numerical values, memorizing the digital values, processing the digital values and saving the resulting data. Advantageously, the current value sensed at the terminals is separated from the respective voltage by introducing a predetermined and preset delay or advance or phase shift, and either the voltage or the current value is shifted 90° in relation to the other following the analog-digital conversion, so as to allow calculation of the reactive power of the circuit, by memorizing the digital value for a duration corresponding to one quarter of the period of the waveform exhibited by the relative periodic quantity reflecting voltage or current.

The method disclosed is implemented preferably by an electronic instrument comprising at least one operational amplifier with inputs connected to two terminals of the electronic circuit of which the periodic electrical quantities are to be measured, and provided with by a reference voltage in such a way that the transmitted output values are entirely positive, also a data processing unit with a switch or other suitable device able to convey signals from several sources to a single user, connected to the output of the operational amplifier, and wired in sequence thereafter, a sample-and-hold circuit, an analog-digital converter, a memory capable of storing data, a shift register associated with the memory, and a timer programmed to generate signals at a constant and predetermined frequency.

The instrument further comprises a control unit integrated with and governing the data processing unit, which can be programmed by software in such a manner as to respond by executing a predetermined succession of steps on receiving a signal generated by the timer.

BRIEF DESCRIPTION OF THE DRAWINGS

The invention will now be described in detail, by way of example, with the aid of the accompanying drawings, in which.

DESCRIPTION OF THE PREFERRED EMBODIMENTS

Figure 7:
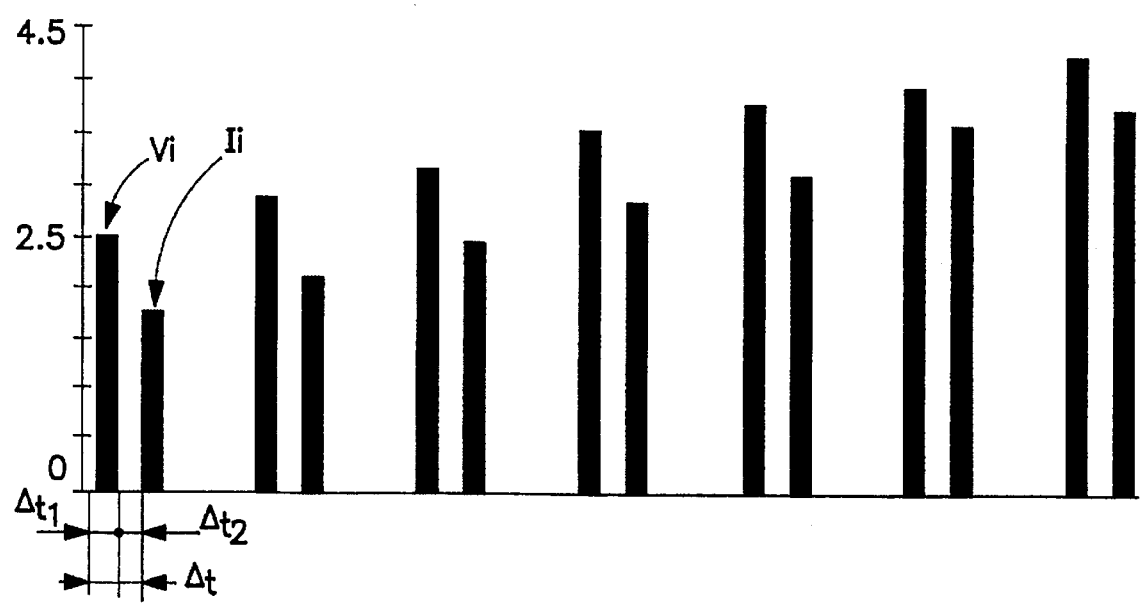
FIG. 7 is a graph drawn on larger scale and showing how voltage and current values are sampled using an instrument as in FIG. 1 or 2.

The method disclosed is based on the conventional technique of sampling, and allows the measurement of periodic electrical quantities in an electronic circuit, digitally and electronically, employing an instrument of notably simple circuitry; the values of electric current and voltage, or viceversa, are sensed by introducing a predetermined and preset delay or phase shift Δt as indicated in FIG. 7, in which $V_i$ and $I_i$ denote the values of input voltage and input current, respectively, or in any event the values registering at the terminals 3 of the monitored circuit.

Likewise according to the method of the invention, the phase shift of 90° between current and voltage, induced to allow the calculation of reactive power, is effected following the step in which the analog values are converted to digital, and obtained by storing the values in a dedicated memory circuit for a period of time equal to that required by the waveform of the shifted periodic quantity to cover the 90°. More exactly, each digital current value is memorized in a storage device having a number of locations equivalent to the number of samples it is intended to effect for each quarter of the current waveform, as will become clear in due course.

Finally, where an operational amplifier is employed in sampling voltage and current values, the method also includes the step of generating an arbitrary reference internally of the amplifier, of which the effect is to render all input values positive and thus allow the use of an analog-digital converter designed to handle positive analog values only. By virtue of this expedient, the operational amplifier can be driven utilizing a power source of positive polarity only.

For a fuller appreciation of the potential afforded by the method disclosed, a preferred instrument for its implementation will now be described in detail with reference to the accompanying drawings.

Figure 1:
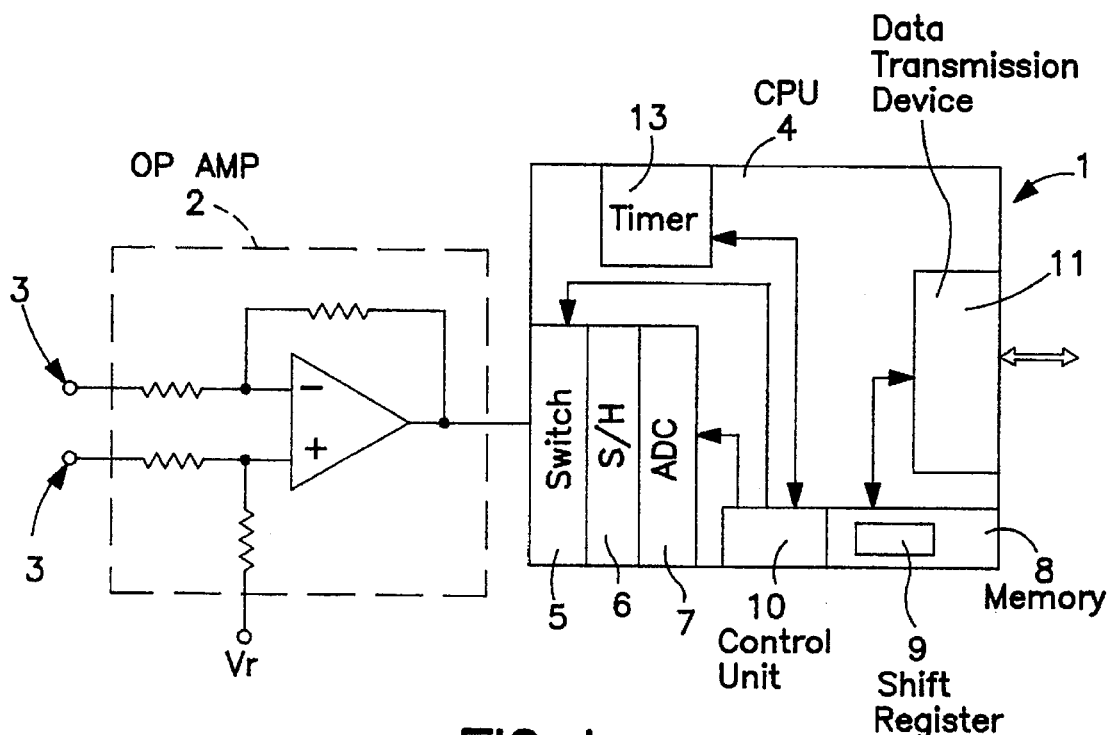
FIG. 1 is the electrical diagram of an instrument for measuring electrical quantities according to the invention, shown in a simple embodiment.
Figure 2:
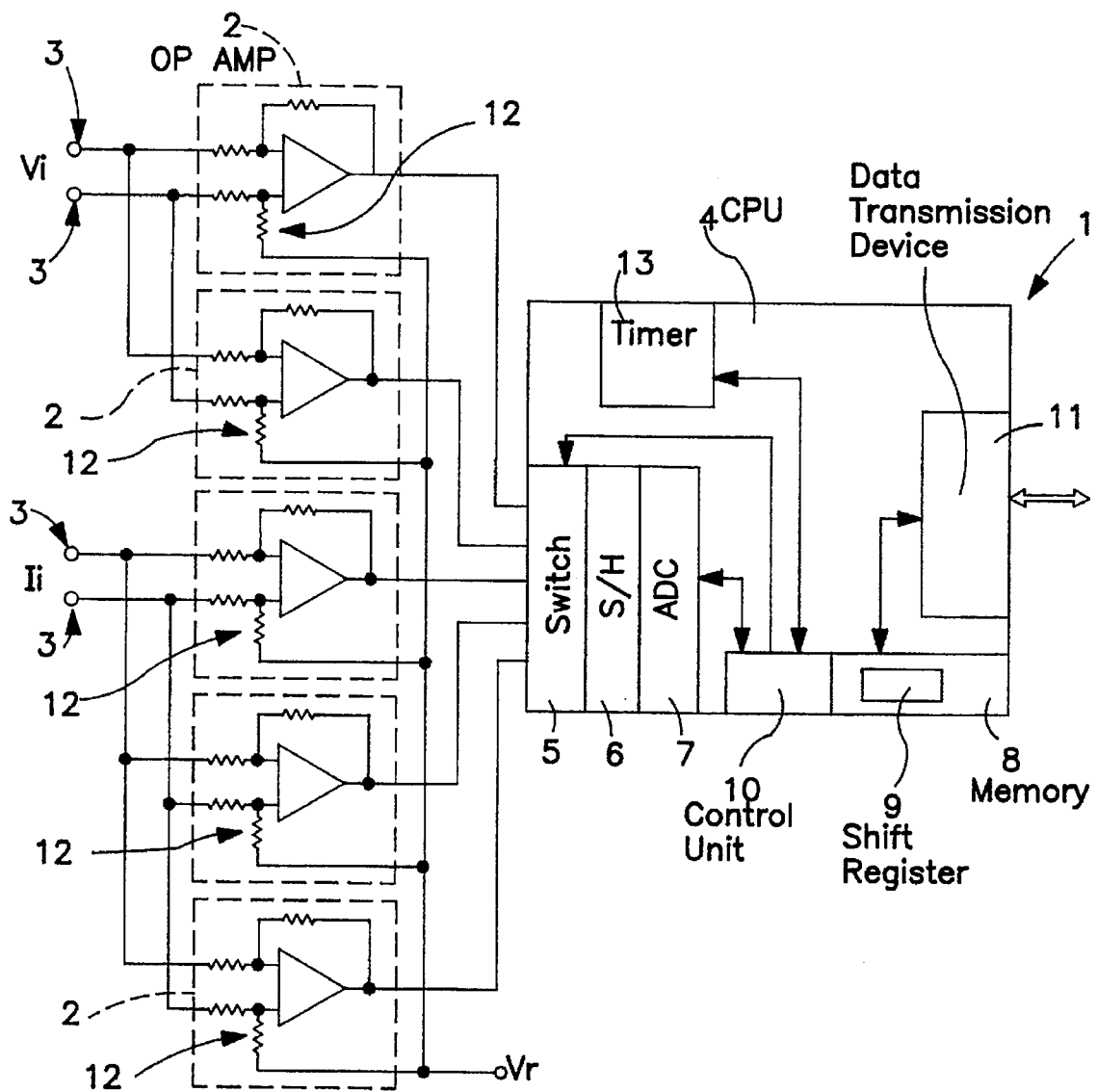
FIG. 2 is an electrical diagram indicating a more complete embodiment of the measuring instrument as in FIG. 1.
Figure 4:
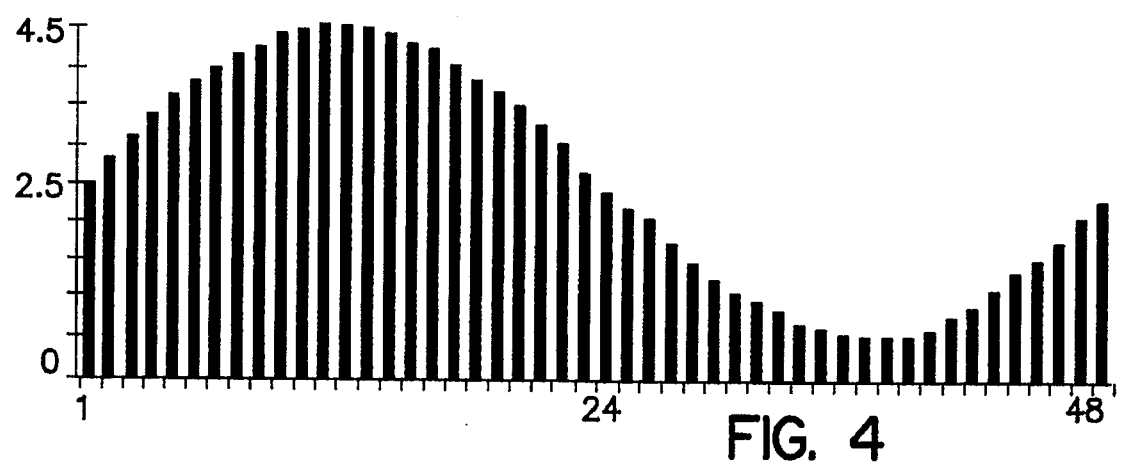
FIG. 4 is a graph showing the waveform of current or voltage generated at 50 Hz, obtainable with an instrument as in FIG. 1 or 2.

The measuring instrument according to the present invention, denoted 1 in its entirety, essentially comprises an operational amplifier 2 and a data processing unit 4. FIG. 1 shows the instrument 1 in a simple embodiment, whereas FIG. 2 illustrates a more complete version of the arrangement in FIG. 1. Reference is made throughout the specification to the second of these two embodiments, purely by way of example.

The data processing unit 4 comprises a plurality of mutually integrated components shown schematically as discrete blocks in FIGS. 1 and 2 so as to give a clear indication of the various operations the unit will be able to perform. The components in question comprise a switch 5, a sample-and-hold circuit 6, an analog-digital converter or ADC 7, a memory 8, a shift register 9, a software-programmable control unit 10, also a data transmission device 11 and a timer 13.

The switch 5 is an electronic device able to direct signals from different sources to a single user. In the particular example of FIG. 2, the inputs of the switch 5 are connected to the outputs of a number of operational amplifiers 2, or of one multiple operational amplifier consisting structurally or functionally in a plurality of single operational amplifiers. In this instance the switch 5 will be operated by the control unit 10 and is capable of supplying an output consisting in the signal from just one of the operational amplifiers 2. The shift register 9 constitutes a part of the memory 8, and is operated by the control unit 10 as a separate device by which a predetermined number of digital values can be memorized, one after another then discarded from their allocated memory locations and restored in sequence from first to last: in short, the shift register 9 operates on the principle of first-in-first-out, or FIFO. The data transmission device 11 permits of connecting the data processing unit 4 to a further device, for example a computer which performs further processing operations on the received data, in this case the exact values of the various measurements. The data transmission device 11 is capable of transmitting data bidirectionally, so as to allow of programming the control unit 10 from an external computer utilizing suitable software. Normally, at all events, the data transmission device 11 will be connected to the memory 8, as illustrated in FIGS. 1 and 2, from which it receives the stored values in the mode and with the timing established by whatever unit may be connected to the data transmission device 11.

The operational amplifiers 2 are associated with a circuit 12 of which the function is to generate a constant and well defined voltage $V_r$ applied to the input stage of each one and serving as a reference value. The operational amplifiers 2 shown in FIG. 2 are all different one from another, inasmuch as the gain of each amplifier is set to ensure its precise operation within a respective and exactly defined range or scale of values. FIG. 2 illustrates five such operational amplifiers 2 of which the first two uppermost in the diagram are used to sense the value of the voltage at the terminals 3, or input voltage $V_i$, whilst the three remaining amplifiers below serve to sense the value of current at the terminals 3, or input current $I_i$. The outputs of all five operational amplifiers 2 are connected to respective inputs of the switch 5, which in turn will supply the sample-and-hold circuit 6 with only one only of the signals received from the operational amplifiers 2, as determined by a command from the control unit 10.

The function of the sample-and-hold circuit 6 is to store the signal received from the switch 5 for the period of time required by the ADC 7 to convert the received signal to a number, which is transmitted to the control unit 10.

The timer 13 clocks the interval and informs the control unit 10 of the exact instant in which the instrument 1 is to respond; in short, the timer 13 gives the sampling frequency, in that it indicates the number of acquisitions of voltage and current values made per unit Of time during the measuring operation.

Figure 9:
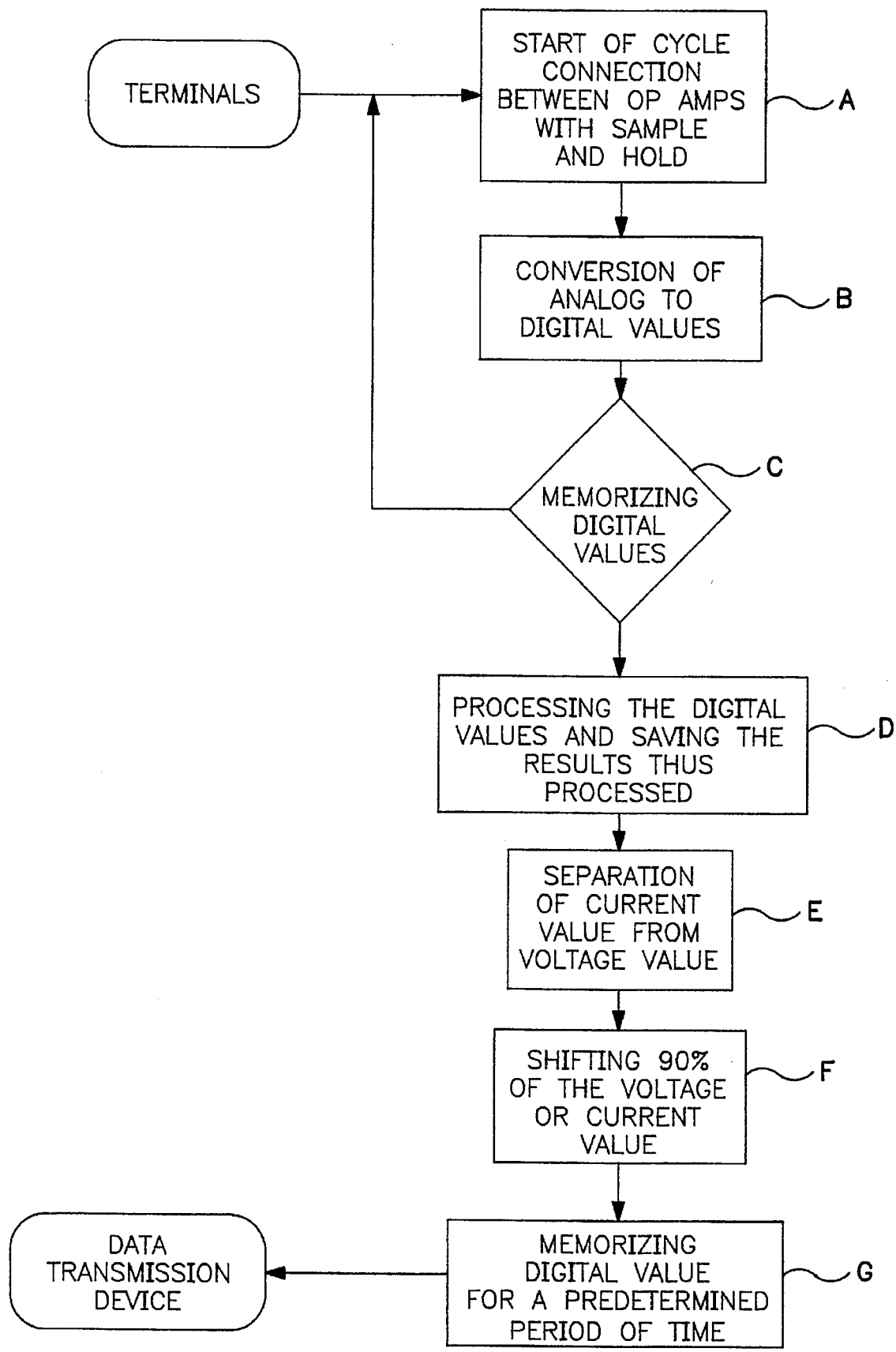
FIG. 9 is a flowchart illustrating the operation of an instrument as in FIG. 1 or FIG. 2.

Observing the instrument of FIG. 2 and the flowchart, of FIG. 9, the operation of the instrument 1 will now be described, to the end-of allowing a fuller appreciation both of the instrument itself and of the method disclosed. Each block of the flowchart is denoted by a single capital letter, with the exception of the first and the last, and it is to these letters that reference is made.

Figure 3:
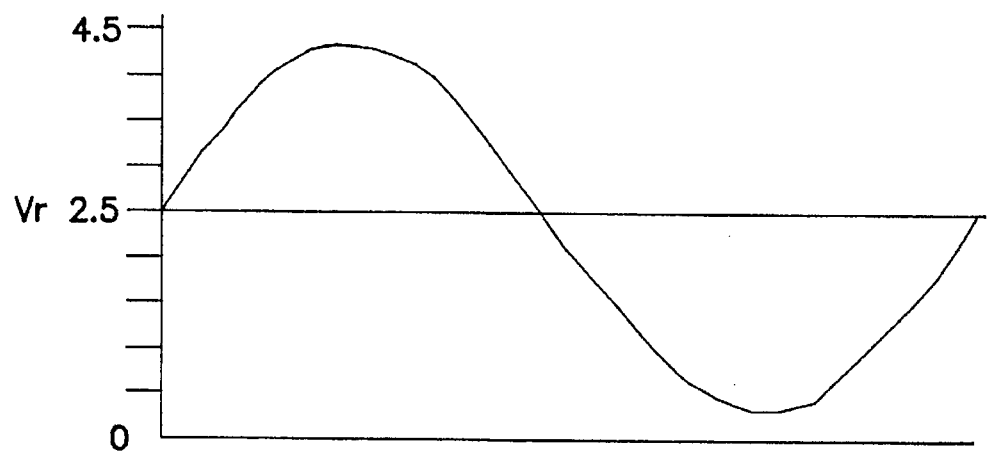
FIG. 3 shows the graph of an electrical quantity modified by the instruments of FIGS. 1 and 2.
Figure 5:
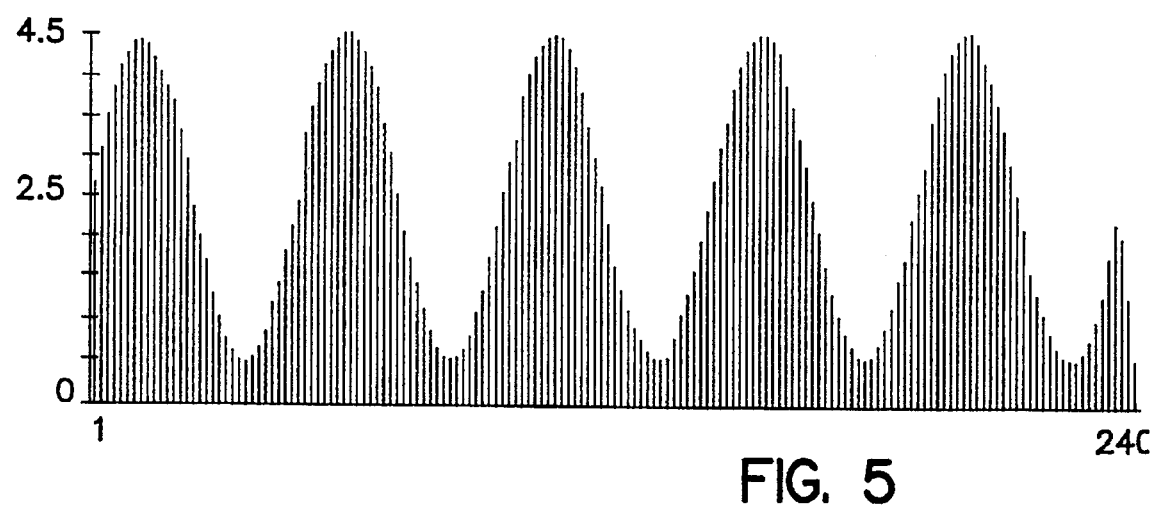
FIGS. 5 and 6 are graphs showing the waveforms of current or voltage generated at 50 Hz and 60 Hz, respectively, obtainable with an instrument as in FIG. 1 or 2 over a complete measuring period.
Figure 6:
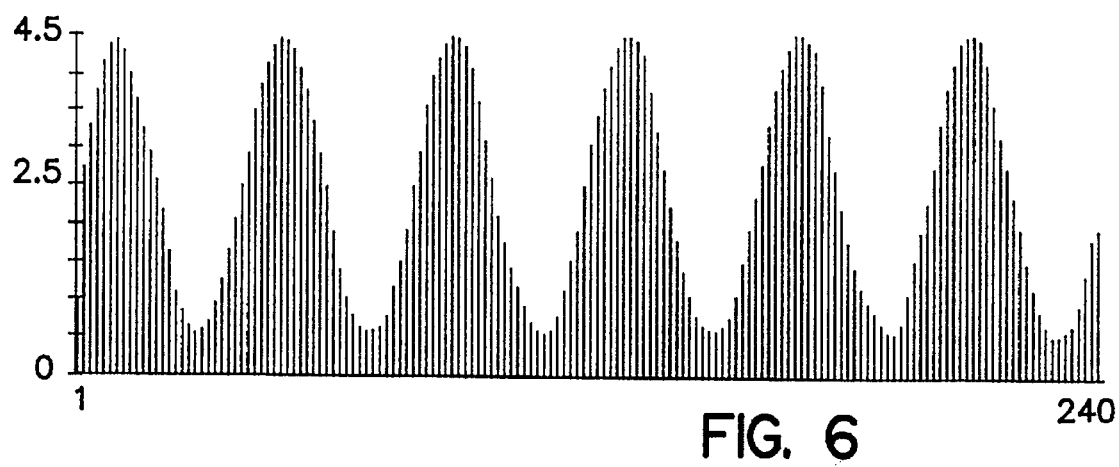

As soon as power is supplied to the instrument 1, the timer 13 begins clocking, and provides the control unit 10 with pulses or signals indicating the start 6f a sensing or sampling cycle. To allow the measurement of periodic electrical quantities in the alternating currents most widely utilized, the instrument effects a number n of samples per unit of time such as will produce a whole number of waveforms for the measured periodic quantity within the clocked period. With regard in particular to those electrical quantities having 50 Hz and 60 Hz frequency respectively, to which reference is made in the specification strictly by way of example, values are sampled over an interval of 100 ms in such a way that a whole number of waveforms can be obtained both from a 50 Hz and from a 60 Hz source Thus, five whole waveforms will be obtained from current and voltage at 50 Hz (see FIG. 5) and six whole waveforms from current and voltage at 60 Hz (see FIG. 6). The measuring period is set at 100 ms, as this is a multiple of the period of one waveform (the period being the time taken by the electrical quantity under scrutiny to return to a given value) whether generated at a frequency of 50 or of 60 Hz. In addition, the number n of samples selected will be a number divisible both by 4 and by the whole number of waveforms occurring in the chosen period, namely 100 ms in the case in point. For 50 Hz and 60 Hz frequencies, the number might be n=240, thus giving 48 samples per waveform in the case of 50 Hz and 40 samples in the case of 60 Hz. The number 240 is also divisible by 4, for a reason that will be made clear in due course. The first step executed by the control unit 10 is that of configuring the switch 5 to establish which two of the operational amplifiers 2, one for voltage and one for current, will supply source values to the data processing unit 4. This selection of operational amplifiers 2 is made on the basis of the values of voltage and current sensed during the previous measurement and stored in the memory 8, or through the intention of a lower gain amplifier 2. The enabling of one operational amplifier 2 rather than another is a step executed automatically by the control unit 10 after each sampling operation, on the basis of the monitored values and of the calculations performed. If the control unit 10 finds that the value of the output from the enabled operational amplifier 2 is less than 25% approximately of its full scale, the switch 5 will be made to connect to a higher gain amplifier 2; conversely, if the measured value is more than 10% approximately of the full scale, the switch 5 will be piloted to select an operational amplifier 2 of lower gain: in neither instance will any manual intervention be involved. At the same time, the circuit denoted 12 generates a reference voltage $V_r$ at the input of all the operational amplifiers 2, as illustrated in FIG. 1 and FIG. 2. The value of $V_r$ will be equivalent to approximately half the reference voltage of the ADC 7, and in addition, the input signal is adjusted in such a way as to regulate the amplitude at a peak-to-peak value equivalent to some 20% less than the dynamic range of the analog-digital conversion circuit. In other words, on the basis of calculations effected by the control unit 10 in the course of a typical measuring operation, the system responds during the successive operations in such a way as to ensure that the peak-to-peak value measured will remain between 25% and 80% of the maximum value that can be measured by the ADC 7, as discernible in FIG 3. In this way, the signals transmitted to the input of the ADC 7 will be entirely positive, as shown in FIG. 3, and the waveform "displaced" upwards by the reference voltage $V_r$. At power-up, the instrument 1 will assume default reference values; in the case of the reference voltage applied to each of the operational amplifiers 2, for example, this will be equal to the voltage $V_r$ generated at the input of the amplifier 2.

A further operation effected by the control unit 10 before commencing the first measurement is that of determining the capacity of the shift register 9, i.e. defining the number of memory locations to be encompassed by the shift register 9 in such a way as to contain one quarter of the samples that can be taken during one complete waveform of the current, or in effect to allow the storing of values sampled over one quarter period. In the case of the example mentioned previously, that is, 240 samples over a period of 100 ms duration, the samples per period of current or voltage will be 40 or 48 in number, according to the frequency. The number of usable locations afforded by the shift register 9 must therefore be 10 or 12, respectively. At the moment in which a pulse is generated by the timer 13 to signal the start of the sampling cycle, the control unit 10 enables the switch 5 to connect one of the voltage-sampling operational amplifiers 2 with the sample-and-hold circuit 6 (block A).

The ADC 7 proceeds to convert the analog voltage $V_i$ received by way of the operational amplifier 2 and the sample-and-hold circuit 6, and having completed the conversion, relays the result to the control unit 10; the digital, voltage value $V_d$ is then entered in a first location of the memory 8 by the control unit 10, which pilots the switch 5 to connect the enabled current-sampling operational amplifier 2 with the sample-and-hold circuit 6. The ADC 7 now converts the sampled current signal $I_i$ to a corresponding digital value $I_d$, and having made the conversion, transmits the result to the control unit 10, which stores the digital current value $I_d$ in a second location of the memory 8 and then waits for a new pulse from the timer 13 marking the start of a new sampling cycle. In practice, the end of one sampling cycle and the start of another can be almost simultaneous, the effect being to maximize the number of samples. It will be observed that the conversion of the current value begins after that of the voltage value, following a delay or phase shift $\Delta t$ which is both known and determinable (see FIG. 7). The phase shift $\Delta t$ in question is a known dimensional quantity, consisting in the sum of two consecutive periods of time denoted $\Delta t_1$ and $\Delta t_2$, where $\Delta t_1$ is the measured and constantly repeated interval of time required by the ADC 7 to convert the voltage sample, and $\Delta t_2$ is the time, likewise measured and constant, taken by the control unit 10 to perform a predetermined and constantly repeated number of operations, which involve entering the digital voltage value $V_d$ in the respective location of the memory 8 and piloting the switch 5. Whilst the effect of the phase shift $\Delta t$ is in practice to introduce an error, the error is a known quantity and therefore easily compensated and corrected. Following the acquisition or memorization of the digital voltage and current values $V_d$ and $I_d$, these values are taken and processed singly: block B of the flowchart denotes the operation of multiplying by 256 to give 16-bit values, the significance of which is well known to a person skilled in the art, followed by summation with those stored previously to allow calculation of the updated reference value for the operational amplifier 2.

In operation, each digital sample value, whether voltage $V_d$ or current $I_d$, is multiplied by 256 and converted into a 16-bit number. This number is then added to the sum of the previous samples processed in the same way, and the resulting value stored in a respective location of the memory 8 which holds the updated result of the summation; the mean value of the 16-bit numbers held in the various locations is then used as the reference or offset value. The reason for using a mean value as the reference or offset value derives from the fact that a periodic quantity such as voltage and current, unless modified as shown in FIG. 3, has a mean value of nothing; accordingly, the reference or offset value for the operational amplifier 2 is obtained by measuring the mean value of the digital values sampled. This mean value is also equal to the sum of the programmed reference value $V_r$ plus the offset value as specified for the operational amplifier 2. This means that, even if the operational amplifier 2 utilized is of modest quality with a relatively high specified offset value, the measurement obtained will nonetheless be notably precise since the offset value is measured and discounted continually. Accordingly, after each digital value $V_d$ and $I_d$ has been multiplied by 256, the offset value of the operational amplifier 2 is subtracted. Thus, one obtains a 16-bit number with the relative sign. The two bytes of each digital voltage and current value are shifted in such a way as to obtain an 8-bit number with the relative sign and thereby ensure greater precision, the resulting digital voltage and current values $V_d$ and $I_d$ being compensated. Further attention may be given to this aspect of the method before proceeding, in order to illustrate how with simple mathematical operations performed by the data processing unit 4 it becomes possible to obtain precise measurements, even with operational amplifiers 2 of unremarkable quality. Each sample, an 8-bit number, is multiplied by 256 and converted into a 16-bit number. This number is then added to the other 16-bit numbers memorized previously, whereupon the 16-bit offset value, measured and calculated during the previous cycle, is subtracted from the number obtained by multiplication of the digital voltage value ($V_d \times 256$). The number obtained, still a 16-bit number, contains a sign and 6 or 7 bits in the most significant byte (8 bits). The fact that the number has a sign, positive or negative, can be discerned by observing FIG. 3 and considering the horizontal straight line passing through the value denoted $V_r$ as representing the 'x' axis. As concerning errors, the following observation may be made: where use is made of an analog-digital converter for the purpose of effecting measurements, it has to be remembered that such a device occasions an element of error generally proportional to its own number of bits. For example, an 8-bit converter has a typical error of plus or minus one bit, equivalent thus to 0, 5% of the full scale. If the quantity to be measured is a quantity varying cyclically over time, as in the case of the disclosure, it can be demonstrated that, applying the effective value formula in the sampling method described above, the ultimate error in the measurement is reduced by a factor equal to the square root of the number of samples effected. This being the case, the subtraction of an 8-bit number gives place to a systematic error that is not compensated in the procedure described above. Accordingly, the step of subtracting the reference or offset value of the operational amplifier 2 is made a 16-bit operation in such a way as to reduce the systematic error introduced, by $\frac{1}{256}$. The end result is converted back to 8 bits plus sign and rounded up to ½ bit, in such a way as allows the successive operations using 8-bit mathematics to be performed at high speed and without introducing any systematic error.

The digital value is memorized and utilized in the form of an 8-bit number in order to reduce both the amount of memory needed and the time necessary for calculation, since the use of a 16-bit number would require a more powerful data processing unit 4 and increase the calculation time not twofold, but in fact fourfold over that needed for an 8-bit number. The use of a 16-bit offset value also permits of eliminating one product in calculating each sample.

If the resulting corrected digital value is $I_{1i}$, relative to the current, this is memorized in the shift register 9, and more precisely in the first free location of the shift register 9, and will be processed no further. Both digital values $V_{1i}$ and $I_{1i}$ are squared, then added to the corresponding results of previous sums, the results being read in respective storage locations of the memory 8, and the updated sums then saved in the same locations. The digital voltage and current values $V_{1i}$ and $I_{1i}$ are multiplied together and the result is added to the result of the sum of the corresponding previous products. The final result of the sum is saved in a respective location of the memory 8. This product and the relative sum are used in the calculation of active power $P_1$ as will be described in due course. The digital voltage value $V_{1i}$ is multiplied by the value $I_{90i}$ memorized first in sequence in the shift register 9, and the resulting product is added to the sum of the corresponding products, whereupon the final result of the addition is memorized in a respective location of the memory 8. Given that the value saved first in the shift register 9 refers to ten or twelve operations beforehand (the example, it will be remembered, allows for 50 Hz and 60 Hz frequencies alike), the digital voltage value $V_d$ is multiplied by the digital current value $I_{90i}$ phase shifted 90° from the voltage value $V_d$ in question. The resulting produce and the sum of such products are then used in the calculation of reactive power. Naturally, the digital current value $I_{90i}$ supplied by the shift register 9 is then discarded to allow the memorization of a new digital current value, posterior to those remaining. In simplistic terms, considering the various values as if lined up one behind the other, each operation consists in the last value being extracted and the remainder moved back one place so as to vacate the first position, this being the position in which the most recent value sampled and calculated is always memorized. The calculations relative to each sample are thus complete, and the procedure, both of measuring the voltage and current values and of performing the relative calculations, will be repeated n times (block C, FIG. 9). In the particular case in point, the calculations continue to be repeated until such time as 240 samples have been counted, whatever the frequency of the voltage and current (50 or 60 Hz). Once all the n samples are available, the control unit 10 will proceed to execute those calculations required to obtain the values of the primary and secondary electrical quantities relative to the electronic circuit from which the signals are taken at the terminals 3. These operations (block D) are performed with the aid of software by the control unit 10, which processes the various values stored in determined locations of the memory 8 and applies additional correction values stored similarly in other locations of the memory 8. The execution of these calculations is especially fast, depending purely on the speed of the data processing unit and is entrusted to a single element characterized by low cost though lacking nothing in precision; in effect, the data processing unit 4 will consist in just such an element. First to be calculated are the measured voltage and current values, using the same formula, that is to say, in which the measured voltage value $V_{1RMS}$ and the measured current value $I_{1RMS}$ are each equal to the square root of the sum of the squares of the respective digital values $V_{1i}$ and $I_{1i}$, divided by the number of samples, say 240. In the case of active power $P_1$, this equals the sum of the products obtained by multiplication of the single digital voltage values $V_{1i}$ and the relative digital current values $I_{1i}$, divided by the number of samples. Apparent power $S_1$, on the other hand, is equal to the product obtained when multiplying together the measured voltage $V_{1RMS}$ and measured current $I_{1RMS}$, whilst reactive power $Q_1$ equals the square root of the difference between the squares of apparent power $S_1$ and active power $P_1$. Measured reactive power $Q_{1m}$ equals the sum of the products given by multiplying the single digital voltage values $V_{1i}$ and phase-shifted current values $I_{90i}$, divided by the number of samples. The last of the electrical quantities measured is power factor PF, which equals the ratio between active power $P_1$ and apparent power $S_1$. At this point, again utilizing software, the control unit 10 proceeds to correct, or rather compensate the active power and reactive power values $P_1$ and $Q_{1m}$ on the basis of the phase shift $\Delta t$ introduced when measuring the voltage and current values $V_{1i}$ and $I_{1i}$ (blocks E and F). Before the compensation is applied, a check is run to verify the sign of the measured reactive power $Q_{1m}$. It will be observed that the ability of the instrument 1 disclosed to verify the sign of the measured reactive power $Q_{1m}$ is attributable to the fact that the digital values of voltage $V_{1i}$ and phase-shifted current $I_{90i}$ incorporate the relative sign and are calculated throughout the entire cycle of the current and voltage, not merely during one quadrant of the waveform, i.e. 90° only, as occurs in the case of instruments embraced typically by the prior art. Accordingly, it becomes possible to verify the sign of the measured reactive power $Q_{1m}$ and consequently to establish whether the monitored circuit is capacitive or inductive. With the sign of the measured reactive power $Q_{1m}$ thus known, the control unit 10 will consult a compensation table, stored in the memory 8, which is compiled by means of mathematical calculations deriving from known laws of electrical engineering. Reading the table, the control unit 10 identifies the phase shift $\Delta t$ introduced for measurement purposes, selects the corresponding compensation factor and applies it in multiplication both to the active power value $P_1$ and to the measured reactive power value $Q_{1m}$, in such a way as to obtain the exact values of these secondary periodic electrical quantities.

All the values thus calculated, and if necessary compensated, are saved in determined locations of the memory 8, from where they can be retrieved by the data transmission device 11 as frequently as may be required without affecting the operation of the instrument 1 in any way. The data transmission device 11 might be connected to a display on which the various values are read out, or to a computer, which will store the data, or indeed to any given medium. At all events, the instrument 1 continues to operate in the manner prescribed irrespective of the particular use to which the data transmission device 11 may put the definitive values stored in the memory 8.

Considering the method according to the invention again at this point, in the light of the foregoing description of the relative instrument 1 and its operation, the advantages will be clearly evident, namely: a reduction in the cost of instruments for the electronic measurement of periodic electrical quantities, and greater precision and repeatability of the measurements effected.

The fact of applying an arbitrary reference to the operational amplifier 2 allows the use of an ADC 7 integrated into the data processing unit 4, since the device processes positive values only. This is in no way a limitation however, since the software used in conjunction with the control unit 10 is able, and with absolute precision, to compensate the converted digital voltage or current value $V_d$ or $I_d$ generated by the ADC 7 on the basis both of the arbitrary reference applied to the operational amplifier 2 and of the offset value calculated for the amplifier.

Figure 8:
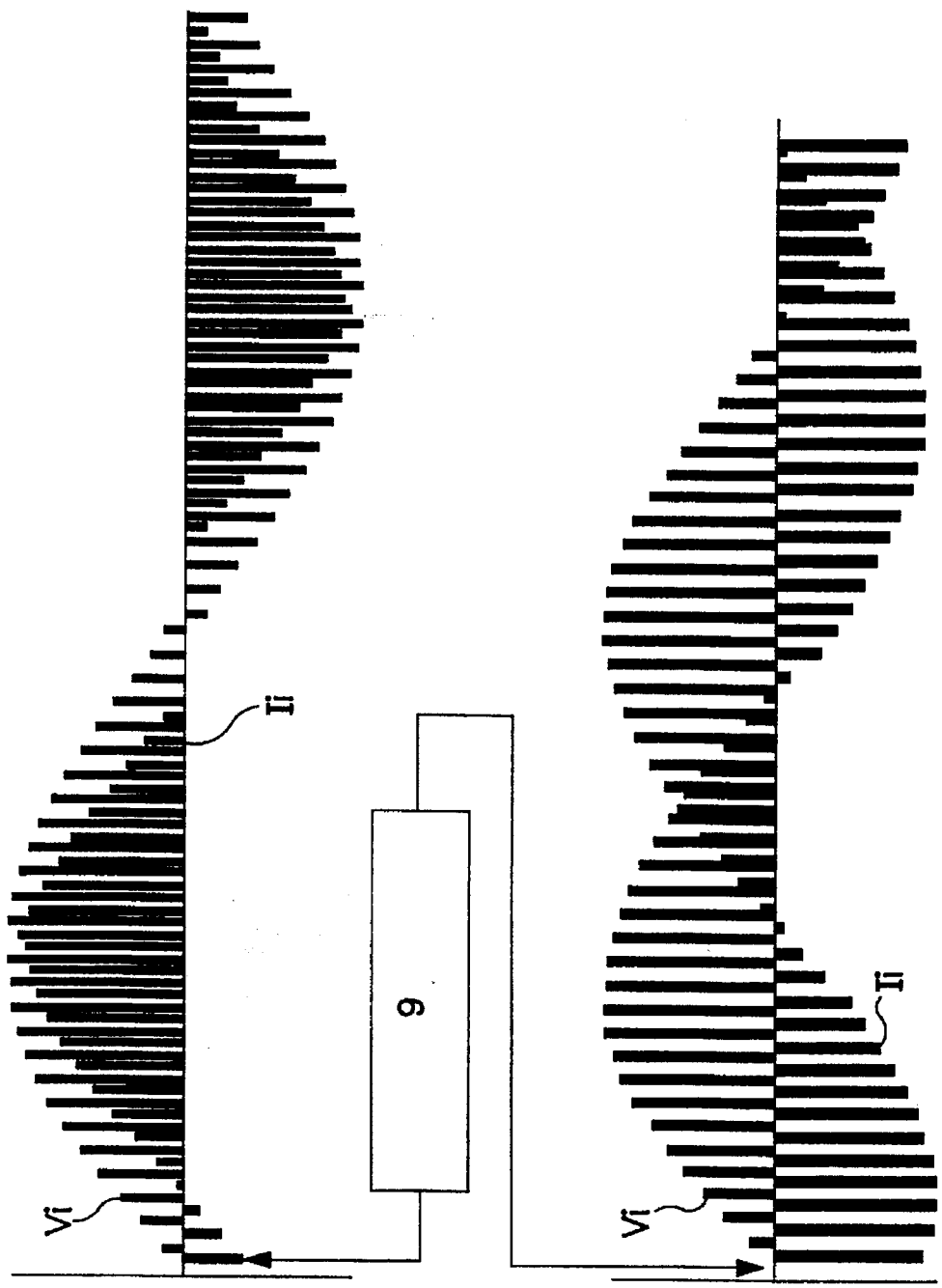
FIG. 8 shows two graphs illustrating the effective values respectively of voltage and current in phase and of voltage and current 90° apart, suitable for use in calculating active power and reactive power, obtainable with an instrument as in FIG. 1 or 2.

The introduction of a known and predetermined phase shift between the voltage and the current allows the use of one operational amplifier 2 only and of one sample-and-hold circuit 6 only, also of just one analog-digital converter 7, integrated with and incorporated into the data processing unit 4, for the purpose of monitoring both voltage and current. Likewise in this instance, the software allows full knowledge and correction of the error introduced Finally, the adoption of a data processing unit 4 piloted by appropriate software allows the use of a plurality of operational amplifiers 2 connected to the switch 5 of the data processing unit 4, thereby gaining not only the economic benefit of replacing a single high-cost amplifier with several standard operational amplifiers, but also greater precision inasmuch as any offset built into the amplifiers is measured individually and suitably compensated. Observing FIGS. 5 and 6 in particular, it will be seen how a greater number of samples can reproduce current and voltage waveforms with a high degree of precision. The two graphs of FIG. 8 show voltage and current waveforms superimposed, the top graph with the current in phase, and the bottom graph with the current in quadrature as a result of inducing the phase shift Δt, to allow the calculation of active and reactive power.

As regards conversion errors, these are reduced in the method disclosed by a factor proportional to the square root of the number of samples.

The values of the periodic electrical quantities measured can be retrieved from the memory 8 via the data transmission device 11 using a computer which, suitably programmed by software, will be able to perform an exact calculation of the power absorbed by the monitored circuit as long as the instrument is on standby or activated.

An instrument 1 as described above, equipped with an additional switch 5, can be used to measure the single phases of a three-phase system, in sequence, sampling for 100 ms on each phase. If the sine and the cosine of the phase angle between voltage and current are known, also the type of connection, it will also be possible to reconstruct any parameter using conventional laws of electrical engineering.

What is claimed:

1. A method for the digital electronic measurement of periodic electrical quantities in an electronic circuit, namely primary quantities such as voltage and current and for measuring secondary quantifies such as active and reactive power and power factor, which utilizes sampling and comprises the steps of sensing an analog value of voltage and current registering at two terminals of the electronic circuit, said sensing executed for each successive sample; converting the respective sensed analog values into respective digital values; memorizing the digital values; processing the digital values and saving the results thus processed, wherein the current value sensed at the terminals is separated from the corresponding sensed voltage value by inducing a predetermined and preset phase shift wherein the, current value is shifted by 90° in relation to the voltage after the conversion of values from analog to digital, in order to facilitate a calculation of the reactive power of the circuit, said reactive power calculated by memorizing the digital value for a period of time corresponding to one quarter of the period of a waveform exhibited by the relative periodic quantity reflecting one of the voltage and current values, wherein the step of sensing voltage and current values is effected by means of an operational amplifier to which an arbitrary reference voltage is applied thereto, said reference voltage being additive to all values monitored by the amplifier such that all values will be positive, and then calculating a mean value for the digital voltage and digital current values, each of said mean values for use in a successive measuring step as offset values for the operational amplifier, which said mean values are subtracted from each corresponding digital voltage value and current value in order to calculate an effective digital voltage and current value for each sample, wherein calculations of the offset values for the operational amplifier and of the effective digital voltage and current values for each sample are performed as 16-bit operations, whereupon the effective digital values of voltage and current are respectively converted to an 8-bit plus sign number prior to their use in the calculation of secondary periodic electrical quantities.

2. The method as in claim 1, wherein the digital current values are memorized in a storage device having a number of memory locations equivalent to the number of samples that can be executed over a period of time corresponding to one quarter of the period of the current waveform, and having the capacity, upon demand, to supply and simultaneously to discard the digital value memorized first in the sequence.

3. An instrument for effecting the digital electronic measurement of periodic electrical quantities at two terminals of an electronic circuit, comprising:

at least one operational amplifier with inputs connected to said same two terminals of the electronic circuit of which the periodic electrical quantities are to be measured, and provided with a reference voltage of predetermined value, said reference voltage additive to said periodic quantities such that all transmit output values are rendered positive;

a data processing unit composed of one of a switch and similar electronic circuit capable of conveying signals from several sources to a single user, connected to the output of the operational amplifier, said processing unit sequentially including after said amplifier, a sample-and-hold circuit, an analog-digital converter, a memory capable of storing data, a shift register incorporated into the memory, and a timer for generating signals at a constant and predetermined frequency; and a programmable logic control unit integrated with and governing the data processing unit, said unit responding to each signal generated by said timer.

4. The instrument instrument as in claim 3, wherein the control unit is programmed to compensate the values of active power and measured reactive power by multiplying each value with a corresponding compensation factor computed on the basis of a delay or phase shift separating acquisition of the values of the voltage and the corresponding current registering at the terminals, retrievable from a relative table of values stored in the memory.

5. The instrument as in claim 3, comprising a plurality of single operational amplifiers, each with a rated gain different to that of the others and each connected electrically to one respective input of the switch, wherein the switch is piloted automatically and independently by the control unit in such a way as to activate the connection between one of the operational amplifiers and the sample-and-hold circuit on the basis of the value of the signal measured during the previous sampling cycle and of the rated gain of the single operational amplifier.

6. The instrument as in claim 5, comprising a plurality of operational amplifiers constructed as a lone multiple operational amplifier.

7. The instrument as in claim 3, wherein the sampling operations are repeated cyclically by the control unit over successive periods of time, each of said periods of time predetermined as exact multiples of the period characterizing the periodic quantity to be measured, the period of the measured quantity being the time taken by that quantity to return to a regularly recurring value, in such a manner that each predetermined period of time will comprise a whole number of waveforms of the periodic quantity to be measured, while the frequency of the signals generated by the timer is such that the number of signals generated during each of the predetermined periods of time will be divisible by four and by the whole number of waveforms of the monitored periodic quantity contained in each of the predetermined periods of time.

8. The instrument as in claim 7, for the measurement of periodic electrical quantities in alternating current circuits of one of 50 Hz and 60 Hz frequency, wherein the sampling operations are repeated cyclically by the control unit for duration periods of 100 ms and wherein signals are generated by the timer at a frequency of 2400 Hz in such a way that the control unit will execute up to 240 sampling cycles in each period of 100 ms.

9. The instrument as in claim 3, wherein a delay and phase shift generated by the control unit is equivalent to a sum of the time needed by the analog-digital converter to convert the analog voltage value registering at the terminals of the monitored circuit, and the time taken by the control unit to execute a predetermined and constantly repeating number of operations.

10. A method of measuring periodic electrical quantities in an electronic circuit having two terminals using a digital electronic measuring instrument comprising the steps of:

providing at least one operational amplifier with inputs connected to said same two terminals of the electronic circuit of which the periodic electrical quantities are to be measured, and provided with a reference voltage of predetermined value, said reference voltage additive to said periodic quantities such that all transmitted output values are rendered positive;

providing a data processing unit composed of one of a switch and similar electronic circuit capable of conveying signals from several sources to a single user, connected to the output of one of the operational amplifiers, said processing unit sequentially including after said one of the operational amplifiers a sample-and-hold circuit, an analog-digital converter, a memory capable of storing data, a shift register incorporated into the memory, and a timer for generating signals at a constant and predetermined frequency; and providing a programmable logic control unit integrated with and governing the data processing unit, said unit responding to each signal generated by said timer, wherein said data processing unit is able to respond, with the instrument activated and on receipt of each signal generated by the time;

commanding the shift register to receive a maximum number of values equivalent to the number of samples acquired in one quarter period of the current waveform;

connecting the operational amplifier to the sample and hold circuit and activating the analog-digital converter to obtain conversion of the value of the voltage registering at the terminals to a digital;

saving the digital voltage value in a respective first location of the memory;

activating the analog-digital converter to obtain conversion of the value of the current registering at the terminals to a digital, inducing a predetermined and constantly repeatable phase shift in relation to the moment of initiating conversion of the corresponding voltage value;

saving the digital current value in a respective second location of he memory;

multiplying the digital voltage value by 256 and adding the resulting product to the sum of the corresponding products stored in a respective third location of the memory, then saving the updated result of the addition in the same third location of the memory;

taking the number obtained from multiplication of the digital voltage value by 256, subtracting the corresponding offset value for one of the operational amplifiers stored previously in a respective fourth location of the memory and dividing the remainder by 256 so as to obtain a compensated and effective digital voltage value, then saving this same value in a respective fifth location of the memory;

multiplying the digital current value by 256 and adding the resulting product to the sum of the corresponding products stored in a respective sixth location of the memory, then saving the updated result of the addition in the same sixth location of the memory;

taking the number obtained from multiplication of the digital current value by 256, subtracting the corresponding offset value for the operational amplifier stored previously in a respective seventh location of the memory and dividing the remainder by 256 so as to obtain a compensated and effective digital current value then saving this same value in a respective eighth location of the memory;

saving the compensated digital current value in the first available position of the shift register;

squaring the compensated digital voltage value, adding the squared compensated digital voltage value to the sum of the previous squared compensated digital voltage values stored in a ninth location of the memory, and saving the updated sum of the voltage values in the same ninth location of the memory;

squaring the compensated digital current value, adding the squared compensated digital current value to the sum of the previous squared compensated digital current values stored in a tenth location of the memory, and saving the updated sum of the current values in the same tenth location of the memory;

multiplying together the compensated digital voltage value and the related compensated digital current value, adding the resulting product to the sum of the corresponding previous products stored in a respective eleventh location of the memory, and saving the updated multiplied sum in the same eleventh location of the memory;

multiplying the compensated digital voltage value by the digital current value memorized first in the shift register, discarding the digital current value first memorized from the shift register, adding the product of the multiplication to the sum of the corresponding previous products stored in a respective twelfth location of the memory, and saving the updated sum in the same twelfth location of the memory;

repeating the procedure of sensing the value of the voltage and that of the corresponding current registering at the terminals and performing the related calculations thereon, for a predetermined number of cycles, on receipt in each instance of a relative signal from the timer;

calculating the root mean square value of the voltage from the sum of the squares of compensated digital voltage values stored in the ninth location of the memory and saving the resulting value in a respective thirteenth location of the memory;

calculating the root mean square value of the current from the sum of the squares of compensated digital current values stored in the tenth location of the memory and saving the resulting value in a respective fourteenth location of the memory;

calculating the value of active power from the sum of products obtained by multiplying together the compensated digital voltage and current values, stored in the eleventh location of the memory, and saving the value in a respective fifteenth location of the memory;

calculating the value of apparent power on the basis of the root mean square values of voltage and current calculated previously, and saving the value in a respective sixteenth location of the memory;

calculating the value of reactive power on the basis of the values of apparent power and active power calculated previously, and saving the value in a respective seventeenth location of the memory;

calculating measured reactive power from the sum of the products obtained by multiplying together the compensated digital phase-shifted current values, stored in the twelfth location of the memory, and saving the resulting value in a relative eighteenth location of the memory;

calculating power factor on the basis of the values of active and apparent power calculated previously, and saving the resulting value in a respective nineteenth location of the memory;

calculating the voltage offset value for the operational amplifier by averaging the sum of the digital voltage values multiplied by 256 stored in the third location of the memory and saving the resulting value in the fourth location of the memory;

calculating the current offset value for the operational amplifier by averaging the sum of the digital current values multiplied by 256 stored in the sixth location of the memory and saving the resulting value in the seventh location of the memory;

compensating the values of active power and measured reactive power calculated previously on the basis of the error generated by the phase shift separating the acquisition of the values of voltage and current registering at the terminals of the monitored circuit.

* * * * *